United States Patent [19]
Miyachi et al.

[11] Patent Number: 6,101,237
[45] Date of Patent: *Aug. 8, 2000

[54] X-RAY MASK AND X-RAY EXPOSURE METHOD USING THE SAME

[75] Inventors: Takeshi Miyachi; Keiko Chiba; Hiroshi Osawa; Koichi Sentoku, all of Utsunomiya; Hiroshi Maehara, Yokohama, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/917,854

[22] Filed: Aug. 27, 1997

[30] Foreign Application Priority Data

Aug. 28, 1996  [JP]  Japan ..................................... 8-226413
Nov. 14, 1996  [JP]  Japan ..................................... 8-302876

[51] Int. Cl.[7] ...................................................... G21K 5/00
[52] U.S. Cl. ................................................. 378/35; 378/34
[58] Field of Search .......................................... 378/34, 35

[56] References Cited

U.S. PATENT DOCUMENTS 5,356,686  10/1994  Fujioka et al. ............................. 428/65
5,422,921   6/1995  Chiba ......................................... 378/34
5,469,489  11/1995  Miyake et al. ............................. 378/35
5,485,495   1/1996  Miyachi et al. ........................... 378/34
5,553,110   9/1996  Sentoku et al. ........................... 378/35
5,793,836   8/1998  Maldonado et al. ....................... 378/35

FOREIGN PATENT DOCUMENTS 63-72119    4/1988  Japan .
2-293716   12/1990  Japan .
4240716     8/1992  Japan ..................................... 378/35

Primary Examiner—Craig E. Church
Attorney, Agent, or Firm—Fitzpatrick, Cella, Harper & Scinto

[57] ABSTRACT

An X-ray mask includes a holding frame, a membrane held by the holding frame, a pattern formed on a surface of the membrane by an X-ray absorptive material, the surface being disposed opposed to a workpiece to which the pattern is to be transferred when the mask is mounted in an exposure apparatus, a member for reinforcing the holding frame and having a portion placed closer to the workpiece than to the membrane and a pellicle provided at a side where the pattern is formed, the pellicle being attached to the portion of the member so that the pellicle is placed at the workpiece side of the membrane.

10 Claims, 8 Drawing Sheets

X-RAY MASK AND X-RAY EXPOSURE METHOD USING THE SAME

FIELD OF THE INVENTION AND RELATED ART

This invention relates to an X-ray mask to be used for X-ray lithography and an X-ray exposure method using such a mask. In another aspect, the invention is concerned with a device manufacturing method based on such an X-ray exposure method.

An increase in the density and speed of semiconductor integrated circuits needs reduction in line width of a pattern of the integrated circuit, and it requires further advancement of performance of semiconductor manufacturing processes. For printing apparatuses, steppers which use light in the X-ray region (2–150 angstroms) for exposure wavelength have been developed.

FIG. 15 shows an example of an X-ray mask structure which can be used in an X-ray exposure apparatus. Basically, an X-ray mask structure comprises an arrangement in which a membrane (X-ray transmission film) 102 for supporting an X-ray absorptive material 103 is held by a holding frame 101. For reinforcement of the holding frame 101, there may be a reinforcement member 104.

Taking mass-production into account, a dust shield is inevitable. Generally, a thin-film dust shield film (pellicle) has been used in optical lithography. For X-ray lithography, the use of a dust shield film has not been considered since organic particles have no adverse effect. However, while the line width of a pattern to be formed by X-ray lithography becomes smaller and smaller, the effect of an organic particle cannot be disregarded, particularly on the point of distribution of the exposure amount.

Washing may be effective as a measure to particles. However, in X-ray lithography, washing is very difficult since the X-ray absorptive material has a high aspect. Also, there may be particles which cannot be cleaned by washing. Further, since the membrane comprises a thin film, the strength is low and it is necessary to reduce the number of washing operations. Additionally, in many cases, an electron beam is used for particle inspection, and light is used for inspection of particles during operation. However, it requires the use of a very complicated technique to distinguish foreign particles from a pattern having a high aspect. There is another problem. That is, as the line width becomes narrower and narrower, a chemical amplification type resist has been used as a resist material for formation of a pattern on a member to be printed. Depending on the type of resist used, there are cases wherein a composite is produced by decomposition during the exposure process and it is deposited on the mask. On that occasion, it may lead a factor that causes changes in the long term period.

Japanese Laid-Open Patent Application, Laid-Open No. 72119/1988 shows the use of a pellicle film with a detachable frame. While this document suggests mounting/demounting during electron beam inspection, there is no attention given to the possibility of use in X-ray lithography, in which there is a clearance of only 100 microns or less between a supporting film and a member to be exposed. More specifically, as shown in FIG. 16, if a thin film 116 is fixed on a plane supporting film (X-ray transmission film) 112 by use of a separate frame 117, it is very difficult to set the clearance between a thin film 116 and a supporting film 112, in micron order.

SUMMARY OF THE INVENTION

It is accordingly an object of the present invention to provide an X-ray mask structure wherein a thin film is disposed between a member to be exposed and a supporting film for supporting an X-ray absorptive material, by which adhesion of particles or a composite to the supporting film can be prevented and, while on the other hand, the clearance between the supporting film and the thin film can be set very precisely.

It is another object of the present invention to provide an X-ray exposure method and/or apparatus which uses an X-ray mask structure as described above, to thereby enable high precision mass-production printing.

In accordance with an aspect of the present invention, there is provided an X-ray mask, comprising: a holding frame; a membrane held by said holding frame, a pattern formed on said membrane by an X-ray absorptive material; and a pellicle provided at a side where the pattern is formed, said pellicle being attached to one of said holding frame itself or a reinforcing member provided for reinforcement of said holding frame.

The X-ray mask may further comprise bore means for releasing gas-tightness between said membrane and said pellicle.

Said pellicle may be fixed by use of an adhesive agent.

An outside periphery of said holding frame may be warped toward the side where the pattern is formed, and said pellicle may be supported at the outside periphery.

The X-ray mask may further comprise a spacer provided on said holding frame and having a thickness larger than that of the pattern, wherein said pellicle may be supported by said spacer.

Said pellicle may have a surface flatness not greater than 3 micron. There may be a clearance between said pellicle and said membrane, which is not greater than 10 microns.

In accordance with another aspect of the present invention, there is provided an X-ray exposure method which uses an X-ray mask as described above, for transferring the pattern of the mask onto a wafer in accordance with a proximity exposure process.

In accordance with a further aspect of the present invention, there is provided a device manufacturing method for producing a device on the basis of a procedure as recited above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

[Embodiment 1]

A first embodiment of the present invention will be described with reference to FIG. 1.

Figure 1:
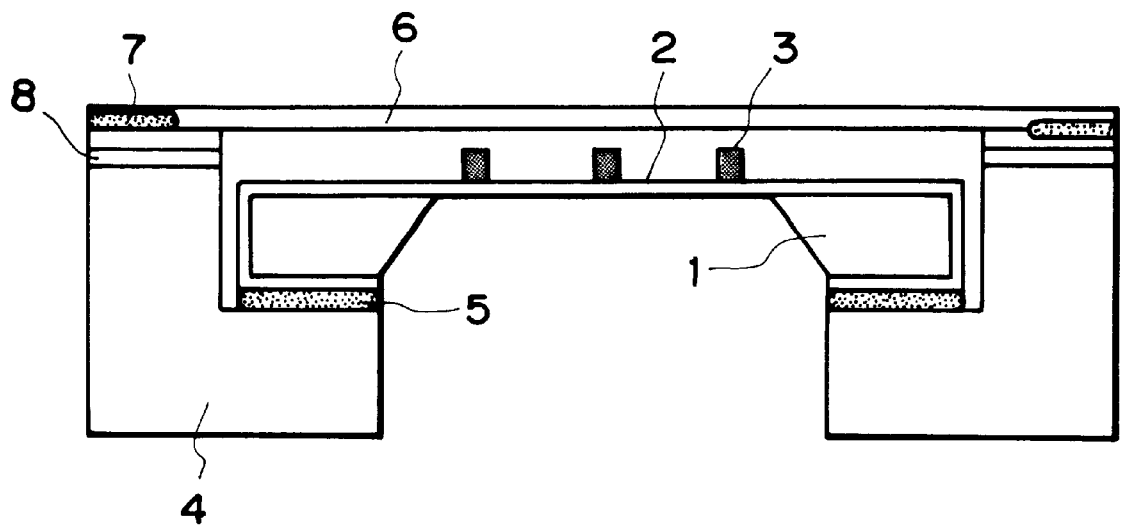
FIG. 1 is a sectional view of an X-ray mask structure according to a first embodiment of the present invention.

As shown in FIG. 1, a holding frame 1 holds a supporting film or membrane (X-ray transmission film) 2 which has formed thereon an X-ray absorptive material 3 corresponding to a pattern to be printed and which is to be disposed opposed to a workpiece (to which the pattern is to be transferred) when it is mounted within an exposure apparatus. The membrane 2 should be sufficiently transmissive to X-rays, and it should be self-supporting. Therefore, preferably it has a thickness in a range of 1–10 microns. As regards the material for the membrane 2, a known material such as an inorganic film of Si, $SiO_2$, SiN, SiC, SiCN, BN, AlN or C, for example, or a single film or composite film of these materials, may be used. The X-ray absorptive material 3 should be sufficiently absorptive to X-rays, and it should be easy to be machined or treated. Preferably, it has a thickness in a range of 0.2–1.0 micron. Regarding the material for the X-ray absorptive member 3, a heavy metal of Au, W, Ta, or Pt, for example, or a compound of these materials may be used. The holding frame 1 may be provided by a silicon wafer, for example.

The holding frame 1 is fixed to a reinforcing member 4 by use of an adhesive agent 5, whereby reinforcement of the holding frame 1 is provided. The reinforcing member 4 may comprise a glass material such as Pyrex glass or silica glass, Si or ceramics, for example. Among them, one having a Young's modulus not less than 50 GPa and a linear expansion coefficient not greater than $1 \times 10^{-5} K^{-1}$, may be preferable.

On the upper face of the reinforcing member 4, that is, on the face which is to be opposed to the workpiece in the exposure process, there is a pellicle 6 detachably fixed thereto by use of a tackifier 7. The upper face of the reinforcing member 4 is placed closer to the workpiece side than to the membrane 2, such that the pellicle 6 is provided closer to the workpiece than to the membrane 2. This pellicle 6 serves to close the space at the workpiece side of the membrane 2.

The pellicle 6 may have a thickness in a range of 0.1–5 microns (preferably, 0.1–1 micron), for prevention of reduction in strength of the exposure X-rays. As regards the material for the pellicle 6, an inorganic film of Si, $SiO_2$, SiN, SiC, SiCN, BN, AlN, or C, for example, a radiation resistive organic film of polyimide, polyester, polyphenylene sulfite, polypropylene, cellulose (nitrocellulose, cellulose acetate), polyvinyl butylal, polymethylmethacrylate, polyvinyl chloride, or polyvinyl acetate, for example, a copolymer of any of these materials, a single film or a composite film of these materials, may be used. For electrification prevention effect, an electrically conductive polymer such as C, ITO, polydyacetylene, poly(p-henylene), polypyrole, polyphenylene vinylen, or polyathene, for example, may be formed on the pellicle. Alternatively, the pellicle 6 itself may be formed of any of these materials. Among them, polyphenylene sulfite is an effective film material since it has a good conductivity and radiation resistivity.

The tackifier 7 has an adjusted tackiness, and it may be selected from acrylic series, silicone series, rubber series or epoxy series. The member to which the pellicle 6 is to be fixed may be an independent member exclusive for the pellicle, or it may be the reinforcing member 4 such as shown in FIG. 1. Alternatively, it may be the holding frame 1. Namely, the pellicle 6 is supported by and fixed to an element that directly or indirectly supports the membrane 2.

The clearance between the pellicle 6 and the membrane 2 is constant. While it depends on the exposure gap between the membrane 2 and the workpiece, preferably the clearance may be not greater than 10 microns. Further, the pellicle 6 may preferably have a flatness not greater than 3 microns. To this end, if the pellicle 6 is to be directly fixed to the holding frame 1, warp or flexure of the holding frame 1 due to the stress of the membrane 2 is utilized, and the pellicle 6 is supported at the topmost portion of the holding frame 1 and is fixed to a side face thereof. On that occasion, while the flatness of the pellicle 6 or the clearance thereof to the membrane 2 may be determined by the warp of the holding frame, the warp of the holding frame 1 can be adjusted by design of the stress of the membrane 2 or of the thickness or rigidity of the holding frame 1. Even if an appropriate warp on an order of a few microns is not obtainable, the holding frame 1 may be machined. On the other hand, if the pellicle 6 is to be fixed to the reinforcing member 4, the pellicle 6 may be supported at the topmost portion of the holding frame as in the foregoing example and it may be fixed to the reinforcing member 4. Alternatively, the pellicle 6 may be reinforced by the reinforcing member 4. In the latter case, the reinforcing member has to be finished precisely and, additionally, when the reinforcing member 4 is fixed to the holding frame 1, its position should be controlled precisely. For such precise position control of the reinforcing member 4 and the holding frame 1, as an example, a similar procedure as by an X-ray mask adhesion device shown in Japanese Laid-Open Patent Application, Laid-Open No. 293716/1991, directed to adhesion between a mask holding frame and a reinforcing member, may be used to perform adhesion of the holding frame 1 and the reinforcing member 4 or coupling of them without use of any adhesive agent.

The outside peripheral portion of the pellicle 6 may be fixed to the holding frame 1 or reinforcing member 4, and the portion of the holding frame 1 or reinforcing member 4 to which the pellicle 6 is to be fixed may be made far remote from the workpiece as compared with the other portion. This assures that the pellicle 6 is supported at its inside of the portion fixed, and that at the thus supported portion, the pellicle 6 is bent toward the direction away from the workpiece. This ensures that the pellicle 6 is fixed while a large tension is applied to the pellicle 6. Thus, the flatness of the pellicle 6 increases. As similar effect may be attained by fixing the pellicle 6 to a side face of the holding frame 1 or reinforcing member 4, or by providing a tapered slant at the outside periphery of the holding frame 1 or reinforcing member 4 and by fixing the pellicle 6 to such a slant portion. On that occasion, the flatness of the portion for supporting the pellicle 6 may preferably be improved by precision machining.

Further, in order to allow adjustment of the pressure between the pellicle 6 and the membrane 2, the reinforcing member 4 is formed with a bore 8 so as to provide communication between the outside and the space between the pellicle 6 and the membrane 2. A filter (not shown) may preferably be disposed in the bore to prevent entry of foreign particles. The bore 8 may be formed in the side face of the reinforcing member 4 as shown in FIG. 1, or it may be formed in the holding frame 1 as a throughbore, extending from the face opposite to the face that supports the pellicle 6. If there is no reinforcing member 4 used, the bore may be formed in the holding frame 1.

As described above, a pellicle 6 is provided between the membrane 2 for supporting the X-ray absorptive material 3 and the workpiece and, additionally, a member for supporting and fixing this pellicle 6 is provided in common by a member that supports the membrane 6 directly or indirectly. This enables high precision control of the flatness of the pellicle 6 and of the clearance between it and the membrane 2. As a result of this, it is not necessary to demount the pellicle 6 even during the X-ray exposure process in which the clearance to the workpiece is not greater than 100 microns. This effectively prevents adhesion of particles or composites by decomposition to the surface of the membrane 2. Therefore, the number of washing operations to the membrane 2 can be reduced or the washing operation itself can be omitted. The lifetime of the mask can be prolonged. Additionally, even in an ambience where there are particles, particles adhere to the flat pellicle 6, not to the membrane 2 on which a high aspect pattern is formed. Thus, particle inspection that uses light can be done easily. Since the pellicle 6 is demountably attached, if particles adhere to the pellicle 6, particle inspection by light is easy, and washing or replacement of the pellicle 6 is easy.

[Embodiment 2]

Figure 2:
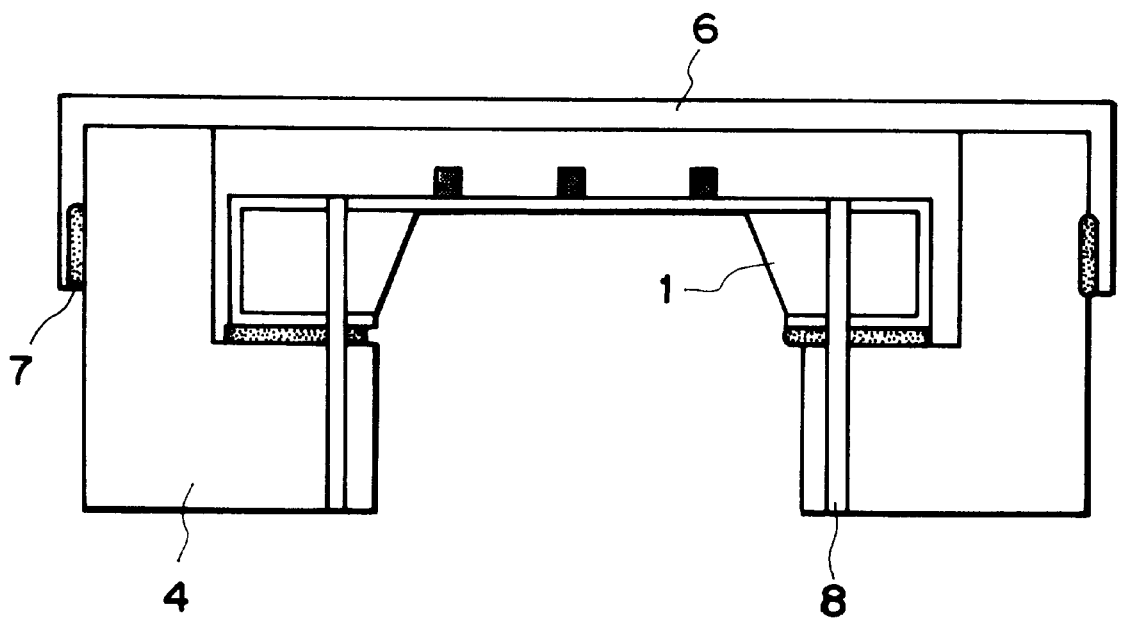
FIG. 2 is a sectional view of an X-ray mask structure according to a second embodiment of the present invention.

FIG. 2 is a sectional view of an X-ray mask structure according to a second embodiment of the present invention. The X-ray mask structure of this embodiment can be produced essentially in the same manner as that of the X-ray mask structure of the first embodiment. For the pellicle 6 in this embodiment, polyphenylene sulfite which is a polymer having good conductivity and radiation resistivity is used. This enables effective prevention of electrification of the pellicle 6, in addition to the advantageous effects as those of the first embodiment.

Further, the fixation of the pellicle 6 onto the reinforcing member 4 with the use of a tackifier 7 is made at the side face of the reinforcing member 4, such that the pellicle 5 is supported while tension is applied thereto. This further increases the flatness of the pellicle 6. Moreover, due to fixation of the pellicle 6 at the side face of the reinforcing member 4, the bore for pressure adjustment is formed through the holding frame 1, from the bottom of the reinforcing member 4.

[Embodiment 3]

Figure 3:
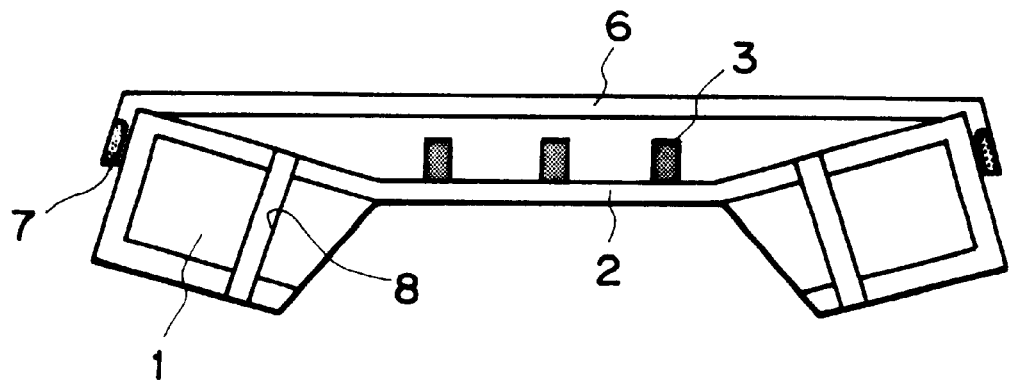
FIG. 3 is a sectional view of an X-ray mask structure according to a third embodiment of the present invention.

FIG. 3 is a sectional view of an X-ray mask structure according to a third embodiment of the present invention. In this embodiment, the holding frame 1 is made of Si, with a thickness of 2 mm. On this holding frame 1, there is a membrane 2 of SiN with a thickness of 2.0 micron which is formed on the frame through a CVD process and supported by the frame. The X-ray absorptive material 3 is formed through sputtering and by the use of W. The holding frame 1 has a warp toward the X-ray absorptive material 3 side, due to the stress of the membrane 2. By using this warp of the holding frame 1, a pellicle 6 made of polyphenylene sulfite is supported at the outermost peripheral portion of the holding frame 1, and it is fixed to the side face through a tackifier 7. The bore 8 for pressure adjustment is formed in the holding frame 1. Since the clearance between the membrane 2 and the pellicle 6 is defined by warping the holding frame 1, the space between them is very small and thus the pressure adjustment becomes very effective.

[Embodiment 4]

Figure 4:
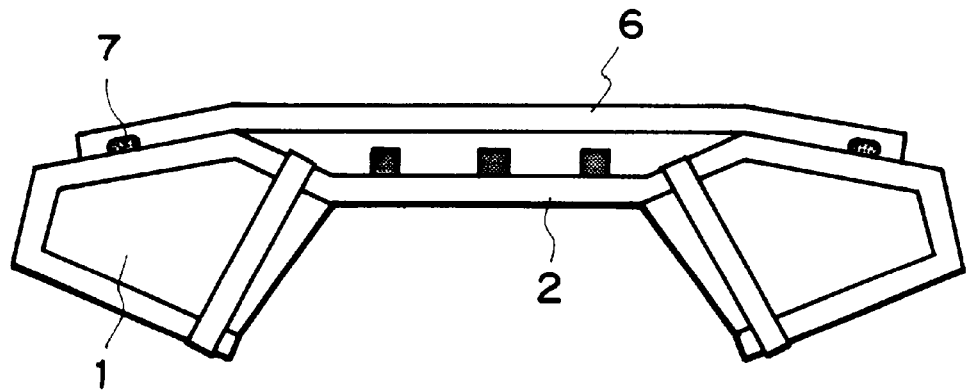
FIG. 4 is a sectional view of an X-ray mask structure according to a fourth embodiment of the present invention.

FIG. 4 is a sectional view of an X-ray mask structure according to a fourth embodiment of the present invention. The X-ray mask structure of this embodiment may be produced essentially in the same manner as that of the X-ray mask structure of the third embodiment. In this embodiment, the outer peripheral portion of the holding frame 1 is machined to be tapered. The pellicle 6 is supported at the topmost portion of the holding frame 1, and it is fixed to the machined portion by a tackifier 7. This embodiment is particularly effective to reduce the clearance between the membrane 2 and the pellicle 6 in a case wherein the warp of the holding frame 1 due to the stress of the membrane 2 is large, as in the case wherein a low rigidity material such as Pyrex glass is used for the holding frame 1.

[Embodiment 5]

Figure 5:
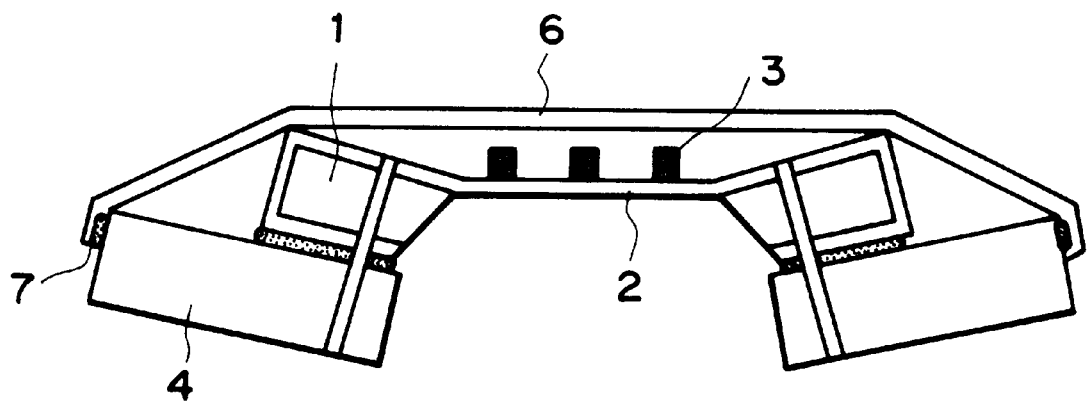
FIG. 5 is a sectional view of an X-ray mask structure according to a fifth embodiment of the present invention.

FIG. 5 is a sectional view of an X-ray mask structure according to a fifth embodiment of the present invention. In this embodiment, the holding frame 1 is made of Si, with a thickness of 2 mm. A membrane 2 of SiC formed through a CVD process and having a thickness of 2.0 micron is supported by this holding frame 1. The holding frame 1 is warped toward the X-ray absorptive material 3 side, due to the stress of the membrane 2. The X-ray absorptive material 3 is formed through sputtering, by using Ta. The reinforcing member 4 is fixed by anode-bonding to the holding frame 1, which is made by a plate-like Pyrex glass. The reinforcing member 4 is warped too, along the holding frame 1. By using the warp of the holding frame 1 and reinforcing member 4, a pellicle 6 made of polyphenylene sulfite is supported at the outermost peripheral portion of the holding frame 1, and it is fixed to the side face of the reinforcing member 4 by using tackifier 7. Substantially the same advantageous effects as those in the second embodiment are attainable with the structure described above.

[Embodiment 6]

Figure 6:
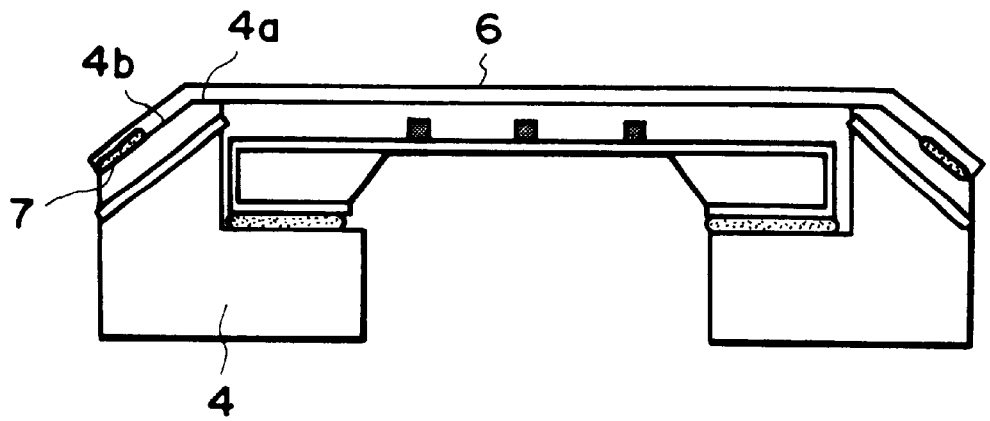
FIG. 6 is a sectional view of an X-ray mask structure according to a sixth embodiment of the present invention.

FIG. 6 is a sectional view of an X-ray mask structure according to a sixth embodiment of the present invention. The X-ray mask structure of this embodiment may be produced essentially in the same manner as that of the X-ray mask structure of the first embodiment. In this embodiment, the reinforcing member 4 has a flat portion 4*a* at its topmost face, and, at the portion outside the flat portion 4*a*, there is a slant 4*a* juxtaposed to the flat portion 4*a*. The pellicle 6 is supported at the flat portion 4*a*, and it is fixed to the slant portion 4*b* by use of a tackifier 7. With the provision of such a slant portion 4*b*, the area of the pellicle supporting region, considerably attributable to the flatness of the pellicle 6, can be made small such that the pellicle supporting region can be machined very precisely, with good flatness. Fixation of the pellicle 6 at the slant portion 4*b* assures that the pellicle 6 is fixed without excessive force applied thereto. While there may be an angle of 0–90 deg. defined between the slant portion 4*b* and the flat portion 4*a*, the angle may preferably be in the range of 0–30 deg. for reduced load to the pellicle 6 and for prevention of corrugation, for example.

[Embodiment 7]

Figure 7:
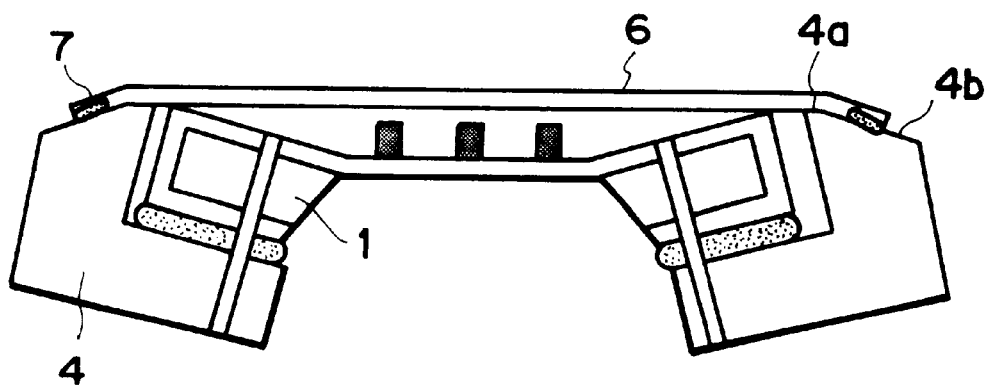
FIG. 7 is a sectional view of an X-ray mask structure according to a seventh embodiment of the present invention.

FIG. 7 is a sectional view of an X-ray mask structure according to a seventh embodiment of the present invention. The X-ray mask structure of this embodiment may be produced essentially in the same manner as that of the X-ray mask structure of the sixth embodiment. In this embodiment, the holding frame 1 and the reinforcing member 4 are warped. The pellicle 6 is supported by the flat portion of the reinforcing member 4 at its topmost portion, and it is fixed to the slant portion by using a tackifier 7. With this arrangement, even if there is a slant portion 4b similar to the sixth embodiment, the load to the membrane 6 can be reduced.

[Embodiment 8]

Figure 8:
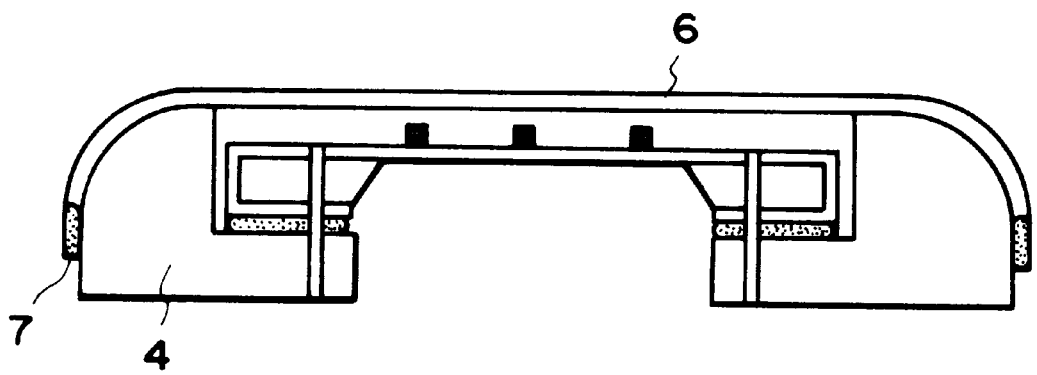
FIG. 8 is a sectional view of an X-ray mask structure according to an eighth embodiment of the present invention.

FIG. 8 is a sectional view of an X-ray mask structure according to an eighth embodiment of the present invention. The X-ray mask structure of this embodiment may be produced essentially in the same manner as that of the X-ray mask structure of the sixth embodiment. In this embodiment, the flat portion at the topmost portion of the reinforcing member 4 is connected to the side face thereof via a smoothly curved surface. The pellicle 6 is fixed to the side face of the reinforcing member 4 by using a tackifier 7. By fixing pellicle 6 along the curved surface of the reinforcing member 4, further reduction of load to the pellicle 6 is attainable.

[Embodiment 9]

Figure 9:
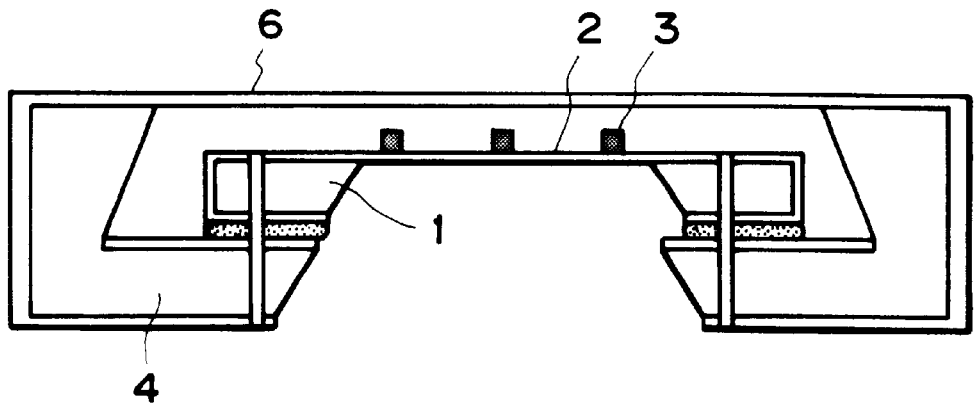
FIG. 9 is a sectional view of an X-ray mask structure according to a ninth embodiment of the present invention.

FIG. 9 is a sectional view of an X-ray mask structure according to a ninth embodiment of the present invention. In this embodiment, the holding frame 1 is made of Si, with a thickness of 2 mm. A membrane 2 made of SiC with a thickness of 0.2 micron, formed through a CVD process, is supported by this holding frame 1. The X-ray absorptive material 3 is formed through sputtering, by using W. The reinforcing member 4 is made of Si, and it is directly attached to the holding frame 1. On the reinforcing member 4, there is a pellicle 4 of DLC (diamond-like carbon) having a thickness of 0.4 micron formed through a CVD process. The pellicle 6 of DLC has a higher radiation sensitivity as compared with an organic film, and it shows good electric conductivity. Thus, it provides a dust shield film with long-term stability as well as an electrification prevention effect.

[Embodiment 10]

Figure 10:
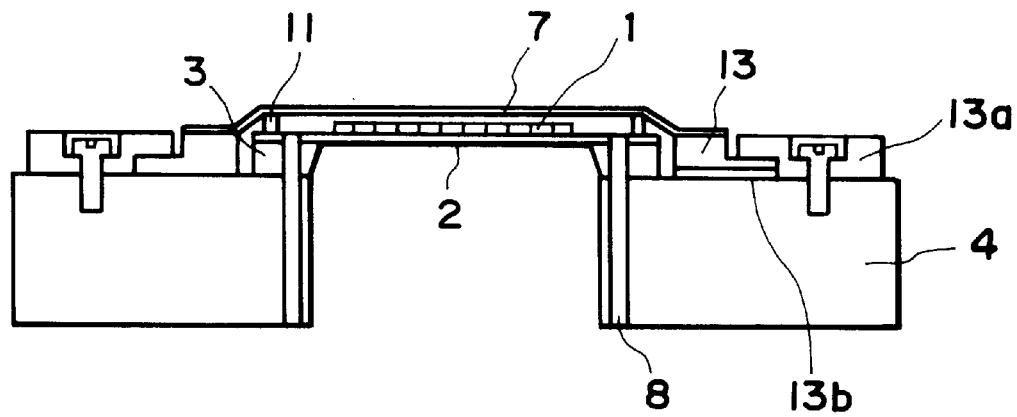
FIG. 10 is a sectional view of an X-ray mask structure according to a tenth embodiment of the present invention.

FIG. 10 is a sectional view of an X-ray mask structure according to a tenth embodiment of the present invention.

A pellicle 2 of SiN is formed through a CVD process to a thickness of 2 microns, on a holding member 3 provided by a Si wafer, and this holding member 3 is adhered to a reinforcing member 4 of SiC. For this adhesion, a known process of direct adhesion or anodic bonding, for example, providing a large adhesion strength, may be used. A communication bore 8 is formed in the reinforcing member 4 and the holding frame 3. After adhesion, the holding frame 3 of Si material is back-etched, from the central portion of the reinforcing member 4 and in the direction of the bore. After this etching, a pattern of an X-ray absorptive material 1 is formed by use of Au. With this procedure, an ordinary X-ray mask structure is completed. Then, the pattern-bearing surface to the absorptive material of this X-ray mask structure is coated with a photosensitive resin (negative resist, for example) to a film thickness of 2–5 microns, and ring-like patterning is performed. The pattern of X-ray absorptive material is formed on the membrane 2, from the X-ray transmissive portion (back-etched portion) toward the outside periphery.

The ring-like pattern formed through the above-described procedure provides a spacer 11. A thin film (pellicle) 7 of SiN is formed on a thin film supporting base plate 13 having a stepped portion at its outer periphery. This pellicle is then placed on the surface of the reinforcing member 4, facing the holding frame 3, with the use of a keeping plate 13a, and it is fixed by the use of screws. The thickness of the pellicle supporting base plate 13 is made equal to that of the membrane holding frame 3, or it is made smaller by a few microns. If the thickness of the pellicle supporting plate 13 is too large, the pellicle of SiN may be destroyed. As a matter of course, the level of the keeping plate 13a and the screws is made lower than the level of the mask surface.

With the procedure described above, the X-ray mask structure at its side to be opposed to the workpiece can be provided with a pellicle such that a dust shield of the X-ray absorptive material pattern is attainable. Also, if the pellicle surface is contaminated by particles, for example, it is easy to replace the pellicle by another. Further, with the provision of communication bore 8, there is no pressure difference created between the outside ambience and the space between the membrane 2 and the pellicle 7. Also, there is no possibility of expansion or contact of them. The pellicle supporting plate 13 are formed with grooves 13b at several locations, for providing communication with the outside ambience.

[Embodiment 11]

Figure 11:
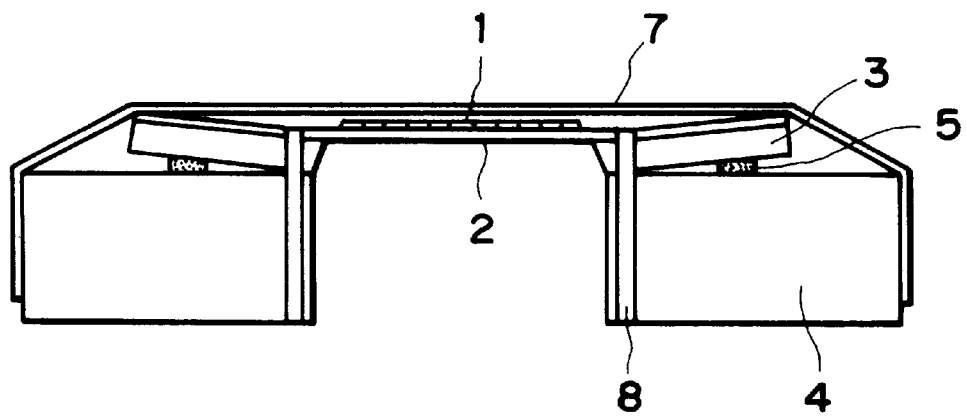
FIG. 11 is a sectional view of an X-ray mask structure according to an eleventh embodiment of the present invention.
Figure 12:
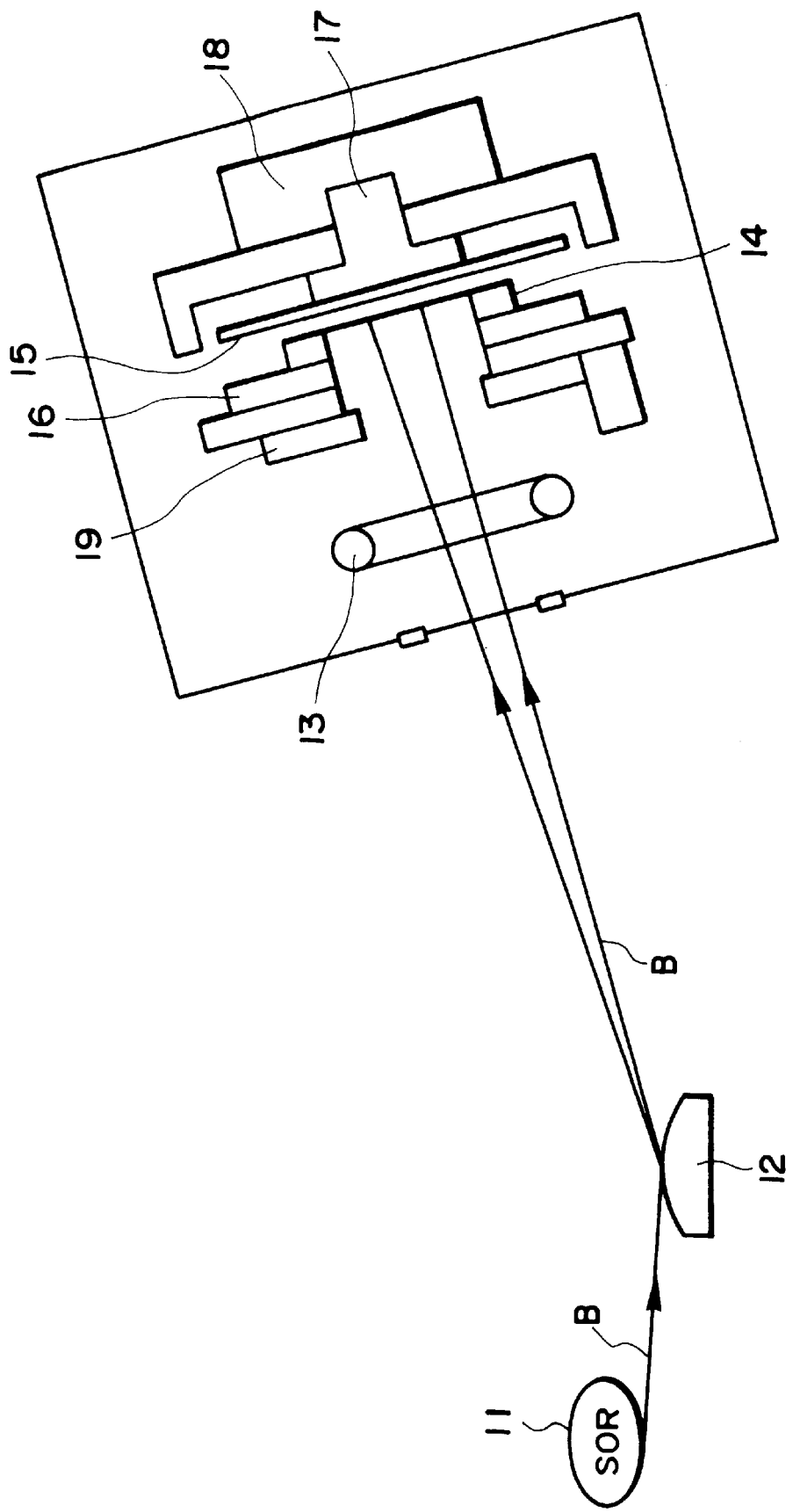
FIG. 12 is a schematic view of an X-ray exposure apparatus according to an embodiment of the present invention.

An eleventh embodiment of the present invention will be described with reference to FIG. 11. In the X-ray mask structure of this embodiment, a membrane 2 is provided on a holding frame 3, having a warp of an amount of 2–6 microns, having been treated by back-etching, and having a communication bore formed therein. A pattern of an X-ray transmissive material 1 is then formed on the membrane 2. The holding frame 3 being warped is then adhered to the reinforcing member 4, by using an adhesive agent, with their communication bores being aligned with each other. A polyimide organic film (pellicle) 7 of having a thickness of 1 micron is then applied to the outside peripheral portion of the holding frame 3, and it is adhered to the outside periphery of the reinforcing member 4 by using an epoxy series adhesive agent. For such a holding frame 3, if it is made from a Si wafer, such a Si wafer having a small orientation flat, may be used. With this procedure, the spacer formation process in the first embodiment can be shortened. If the organic thin film (pellicle) is to be replaced, the adhesive agent may be removed.

[Embodiment 12]

Next, an embodiment of an X-ray exposure apparatus, using an X-ray mask structure of the present invention, for the manufacture of microdevices such as semiconductor devices, thin film magnetic heads, or micro-machines, for example, will be described. FIG. 10 is a schematic view of an X-ray exposure apparatus according to an embodiment of the present invention.

In FIG. 10, denoted at 11 is an SOR radiation source, called an SOR ring. Synchrotron radiation light B emitted from this SOR radiation source 11 has a sheet beam shape, having a uniform light intensity beam expansion in a lateral direction but having little expansion in the vertical direction. This synchrotron radiation light B is reflected by a convex mirror 12 whereby it is expanded vertically. By this, a beam of an approximately rectangular sectional shape is provided and an exposure region of a rectangular shape can be defined. The expanded synchrotron radiation light B is adjusted by a shutter 13 so as to provide a uniform exposure amount within the irradiation region. The synchrotron radiation light B passing the shutter 13 is projected on an X-ray mask structure 14. The X-ray mask structure 14 has a structure similar to that of the X-ray mask structure according to any of the embodiments described above. The X-ray mask structure 14 is attracted to and held by a mask stage 16, at a position opposed to a wafer 15, which is the workpiece to which the pattern is to be transferred.

The wafer 15 is held by a wafer chuck 17 which is mounted on a wafer stage 18. The wafer 15 can be positioned, through the movement of the wafer stage 18.

Alignment unit 19 comprises an optical system for detecting positioning alignment marks provided on the X-ray mask structure 14 and the wafer 15, respectively, and computing means for calculating any deviation between the mask and the wafer. With the use of the X-ray mask structure 14 of the present invention, with respect to different wavelengths used for the alignment process, a transmissivity not lower than 80% (or maximum minus 5%) is attainable. Thus, the signal-to-noise ratio for the alignment light increases and high precision alignment can be accomplished.

After alignment of the X-ray mask structure 14 of the present invention with the wafer 15, the pattern formed on the mask structure 14 is transferred and printed on the wafer 15, in accordance with a step-and-repeat procedure, a step-and-scan procedure or a scanning procedure, for example. This meets mass-production of microdevices based on precision X-ray exposure.

[Embodiment 13]

Next, an embodiment of a device manufacturing method for manufacturing semiconductor devices such as semiconductor chips (e.g., ICs or LSIs) or liquid crystal panels or CCDs, for example, by using an X-ray exposure apparatus such as described above, will be explained.

Figure 13:
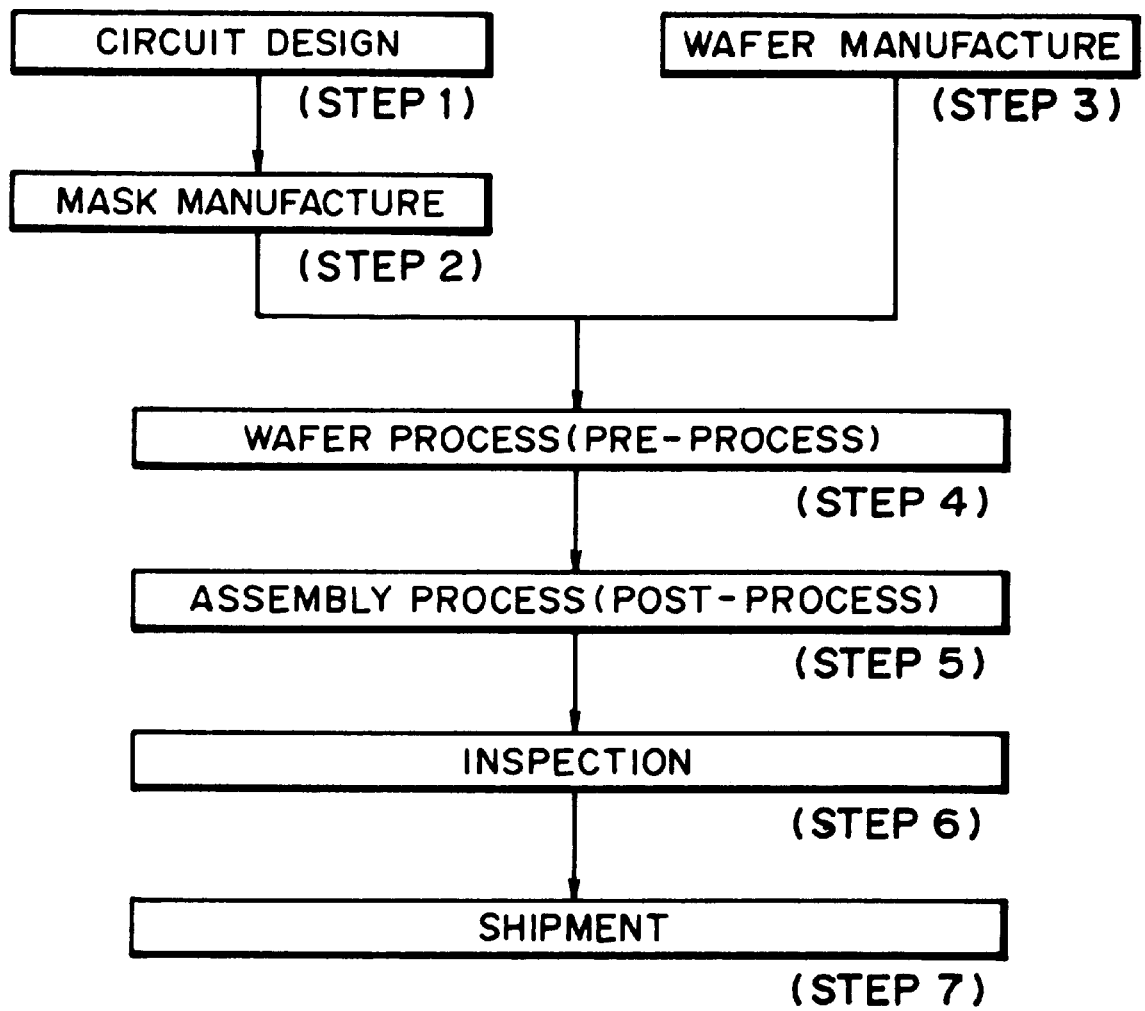
FIG. 13 is a flow chart of semiconductor device manufacturing processes, using an X-ray exposure apparatus of the present invention.

FIG. 13 is a flow chart of a procedure for the manufacture of microdevices such as semiconductor chips. In this embodiment, step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography.

Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, durability check a and so on for the semiconductor devices provided by step 5, are carried out. With these processes, semiconductor devices are completed and they are shipped (step 7).

Figure 14:
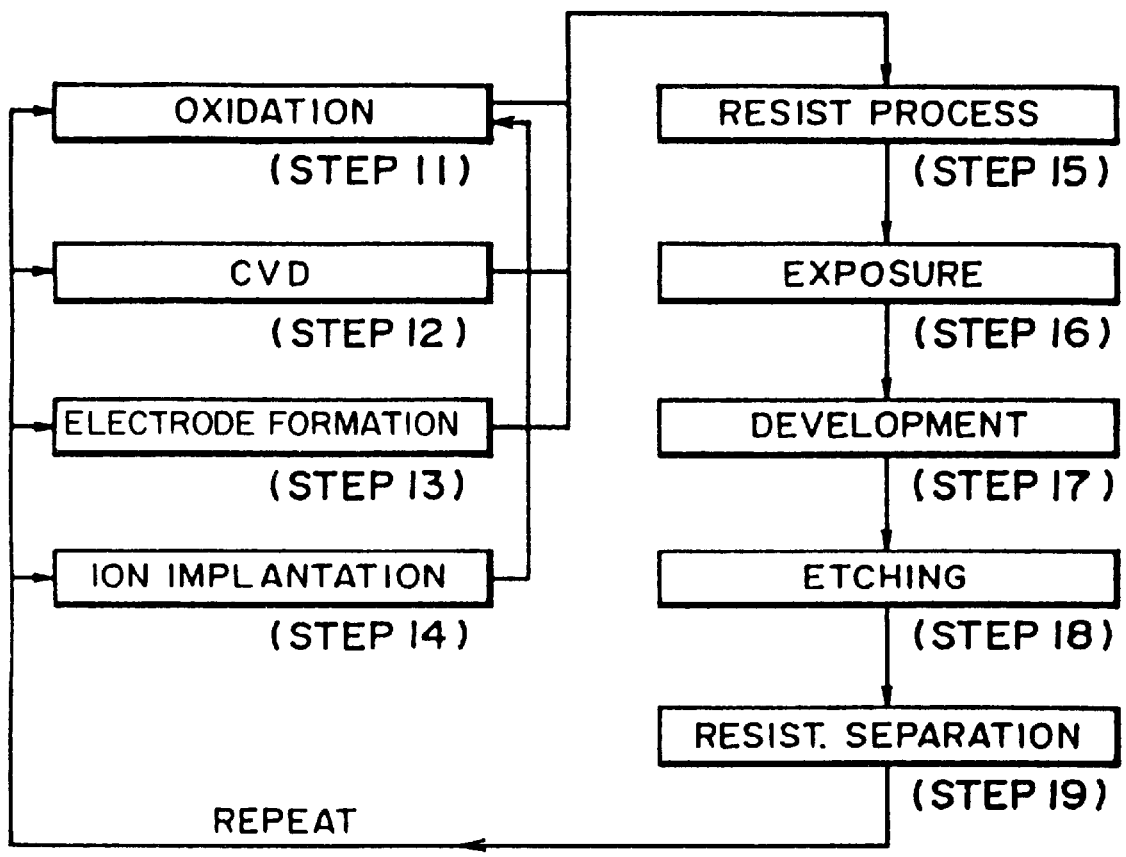
FIG. 14 is a flow chart for explaining details of a wafer process, included in the processes of FIG. 13.
Figure 15:
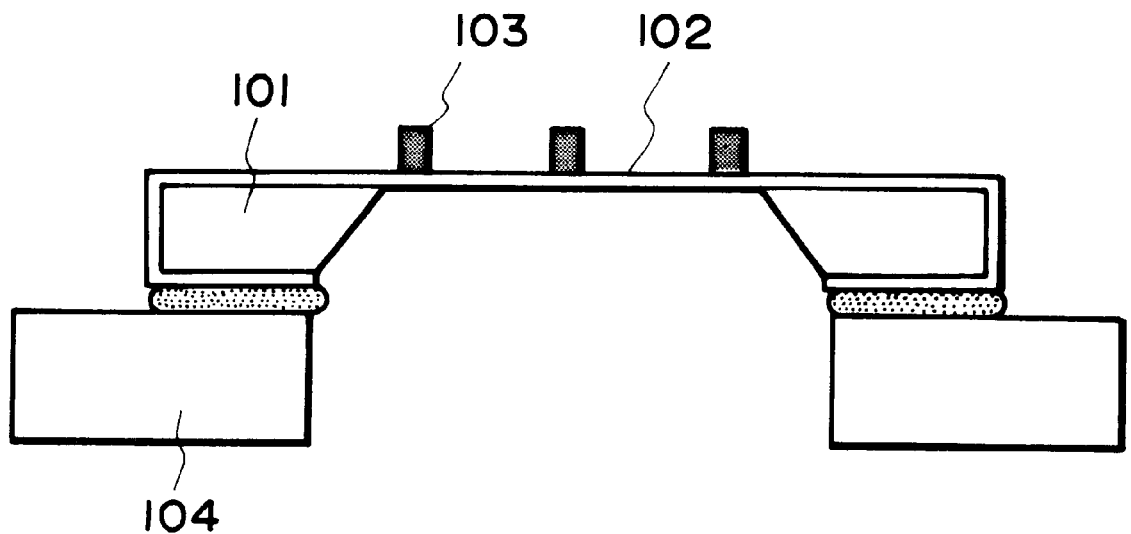
FIG. 15 is a sectional view of an example of an X-ray mask structure.
Figure 16:
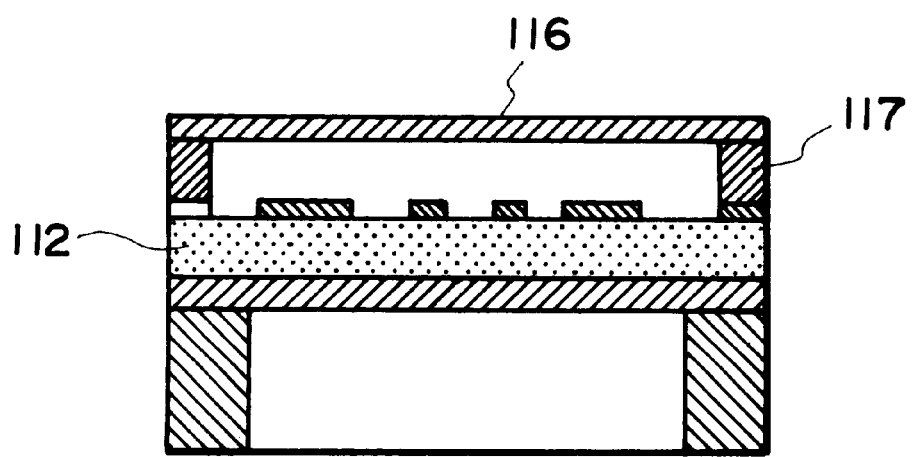
FIG. 16 is a sectional view of another example of an X-ray mask structure.

FIG. 14 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An X-ray mask, comprising:

a holding frame;

a membrane held by said holding frame;

a pattern formed on a surface of said membrane by an X-ray absorptive material, the surface being disposed opposed to a workpiece to which said pattern is to be transferred when said mask is mounted in an exposure apparatus;

a member for reinforcing said holding frame and having a portion placed closer to the workpiece than to the membrane; and a pellicle provided at a side where the pattern is formed, said pellicle being attached to the portion of said member so that said pellicle is placed at the workpiece side of the membrane.

2. An X-ray mask according to claim 1, further comprising bore means for ventiating said membrane and said pellicle.

3. An X-ray mask according to claim 1, wherein said pellicle is fixed by use of an adhesive agent.

4. An X-ray mask according to claim 1, wherein said pellicle has a surface flatness not greater than three microns.

5. An X-ray mask according to claim 1, wherein a clearance between said pellicle and said membrane is not greater than 10 microns.

6. An X-ray exposure method for transferring a pattern of a mask onto accordance with a proximity exposure process, said method comprising:

providing a holding frame;

holding a membrane by the holding frame;

forming a pattern on a surface of the membrane by an X-ray absorptive material, the surface being disposed opposed to a wafer to which the pattern is to be transferred when the mask is mounted in an exposure apparatus;

reinforcing the holding frame with a member having a portion placed closer to the wafer than to the membrane;

providing a pellicle at a side where the pattern is formed, the pellicle being attached to the portion of the member to that the pellicle is placed at the wafer side of the membrane; and transferring a pattern of the mask to the wafer in accordance with a proximity exposure process.

7. A device manufacturing method for producing a device, said method comprising:

providing a holding frame;

holding a membrane by the holding frame;

forming a pattern on a surface of the membrane by an X-ray absorptive material, the surface being disposed opposed to a wafer to which the pattern is to be transferred when the mask is mounted in an exposure apparatus;

reinforcing the holding frame with a member having a portion placed closer to the wafer than to the membrane;

providing a pellicle at a side where the pattern is formed, the pellicle being attached to the portion of the member so that the pellicle is placed at the wafer side of the membrane; and transferring a pattern of the mask to the wafer to produce a device.

8. An X-ray mask, comprising:

a holding frame;

a membrane held by said holding frame;

a pattern formed on a surface of said membrane by use of an X-ray absorptive material, the surface being disposed opposed to a workpiece to which said pattern is to be transferred when said mask is placed in an exposure apparatus;

a pellicle provided at a side where the pattern is formed, said pellicle being attached to a holding member for holding said pellicle; and a spacer separate from said holding member and provided on said membrane said spacer supporting said pellicle at the top thereof so that said pellicle supported by said spacer and said membrane are held apart from each other by a predetermined distance.

9. An X-ray exposure method for transferring a pattern of a mask onto a wafer in accordance with a proximity exposure process, said method comprising the steps of:

providing a holding frame;

holding a membrane by use of the holding frame;

forming a pattern on a surface of the membrane by use of an X-ray absorptive material, the surface being disposed opposed to a wafer to which the pattern is to be transferred when the mask is placed in an exposure apparatus;

providing a spacer on the membrane;

providing a pellicle at a side where the pattern is formed, the pellicle being attached to a holding member, separate from the spacer, for holding the pellicle, wherein the spacer supports the pellicle at the top thereof so that the pellicle supported by the spacer and the holding membrane are held apart from each other by a predetermined distance; and transferring a pattern of the mask to the wafer in accordance with a proximity exposure process.

10. A device manufacturing method for producing a device by use of a mask, said method comprising the steps of:

providing a holding frame;

holding a membrane by use of the holding frame;

forming a pattern on a surface of the membrane by use of an X-ray absorptive material, the surface being disposed opposed to a wafer to which the pattern is to be transferred when the mask is placed in an exposure apparatus;

providing a spacer on the membrane;

providing a pellicle at a side where the pattern is formed, the pellicle being attached to a holding member, separate from the spacer, for holding the pellicle, wherein the spacer supports the pellicle at the top thereof so that the pellicle supported by the spacer and the holding membrane are held apart from each other by a predetermined distance; and transferring a pattern of the mask to the wafer in accordance with a proximity exposure process, to produce a device.

* * * * *

UNITED STATES PATENT AND TRADEMARK OFFICE
CERTIFICATE OF CORRECTION

PATENT NO. : 6,101,237
DATED : August 8, 2000
INVENTOR(S) : Takeshi Miyachi et al..

It is certified that error appears in the above-identified patent and that said Letters Patent is hereby corrected as shown below:

ON THE COVER PAGE AT ITEM [56]:
Under "Reference Cited", "FOREIGN PATENT DOCUMENTS";
"4240716" should read --4-240716--.

IN THE DISCLOSURE:

COLUMN 2:
Line 32, "micron. There" should read --microns. ¶There--.

COLUMN 4:
Line 66, "As" should read --A--.

COLUMN 8:
Line 36, "of" (first occurrence) should be deleted.

UNITED STATES PATENT AND TRADEMARK OFFICE
CERTIFICATE OF CORRECTION

PATENT NO. : 6,101,237
DATED : August 8, 2000
INVENTOR(S) : Takeshi Miyachi et al..

It is certified that error appears in the above-identified patent and that said Letters Patent is hereby corrected as shown below:

COLUMN 9:
Line 46, "durability check a" should read --a durability check--.

COLUMN 10:
Line 26, "ventiating" should read --ventilating--;
Line 36, "onto" should read --onto a wafer in--.

COLUMN 11:
Line 20, "membrane" should read --membrane,--.

Signed and Sealed this

Twelfth Day of June, 2001

*Attest:*

NICHOLAS P. GODICI
*Attesting Officer*     *Acting Director of the United States Patent and Trademark Office*